United States Patent [19]

Eaton, Jr. et al.

[11] 4,389,715

[45] Jun. 21, 1983

[54] REDUNDANCY SCHEME FOR A DYNAMIC RAM

[75] Inventors: Sargent S. Eaton, Jr.; David R. Wooten, both of Colorado Springs, Colo.

[73] Assignee: Inmos Corporation, Colorado Springs, Colo.

[21] Appl. No.: 194,613

[22] Filed: Oct. 6, 1980

[51] Int. Cl.³ .............................................. G11C 11/40
[52] U.S. Cl. .......................................... 365/200; 371/8
[58] Field of Search ............... 365/104, 105, 200, 207, 365/210; 371/8, 10, 21

[56] References Cited

U.S. PATENT DOCUMENTS

| 4,047,163 | 9/1977 | Choate et al. | 365/104 |
| 4,250,570 | 2/1981 | Tsang et al. | 365/200 |
| 4,310,901 | 1/1982 | Harding et al. | 365/200 |

FOREIGN PATENT DOCUMENTS 53-41946  4/1978  Japan ............................... 365/200

Primary Examiner—Joseph A. Popek

Attorney, Agent, or Firm—Edward D. Manzo

[57] ABSTRACT

A redundancy scheme is described for replacing defective main memory cells in a dynamic RAM with spare memory cells. The spare cells are arranged in groups of spare rows and spare columns of memory cells such that a plurality of groups of spare rows and columns of cells are substituted for defective main rows and columns of cells so as to repair relatively large defects which impair adjacent rows and columns of main memory cells. In the preferred embodiment, the RAM includes a plurality of address buffers, each of which receives an incoming row address bit and then an incoming column address bit for sequentially outputting row and column address data. Associated with each buffer is a store for a defective row address, a store for a defective column address, and a comparator. The stores retain defective memory cell addresses which the comparator sequentially compares against the address data sequentially output by the buffer. When the comparator senses a match, a control signal is generated to initiate substitution of spare memory cells for the defective main memory cells.

10 Claims, 11 Drawing Figures

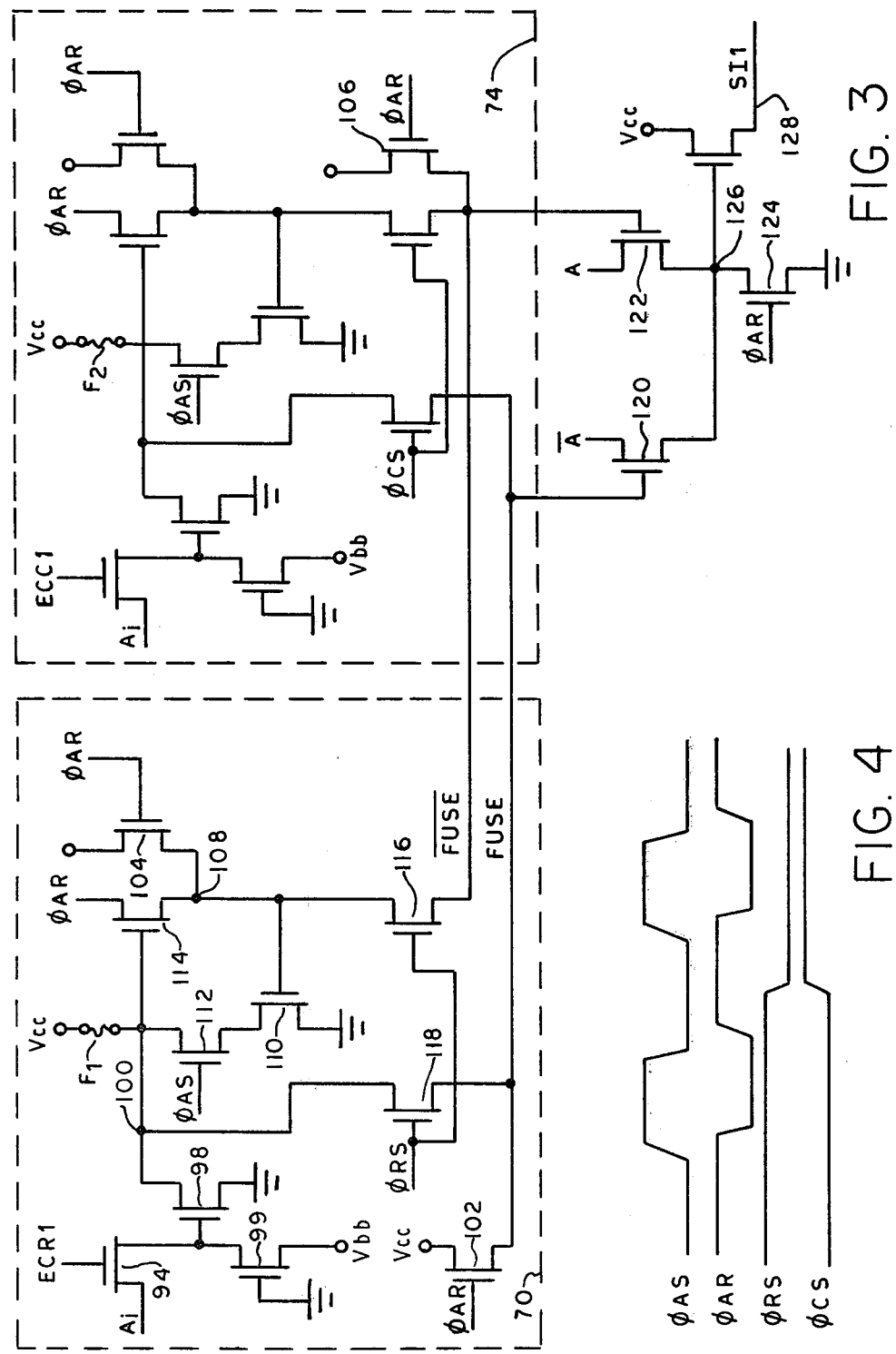

DECODER DISABLING CIRCUITRY 50

MAIN DECODER

SPARE DECODER

SPLIT MEMORY ARRAY

REDUNDANCY SCHEME FOR A DYNAMIC RAM

BACKGROUND OF THE INVENTION

The present invention relates generally to MOS (metal oxide semiconductor) memories, and is particularly directed to an improved redundancy scheme for use in such a memory.

MOS memories generally include a memory array in the form of rows and columns of main memory cells for storing digital data. In a typical memory, there are thousands of individual memory cells, each of which must function properly. A single inoperative memory cell destroys the usefulness of the memory and, therefore, lowers the yield of the wafer on which many memories are simultaneously manufactured.

To increase the yield of each wafer, it has been proposed to include spare memory cells in each chip. Thus, if a main memory cell is found to be defective during testing by the manufacturer, a spare memory cell is selected to replace the defective memory cell.

Some prior schemes for selecting spare memory cells include a single spare column of cells for replacing a main column of cells in which a defective cell is located. Although such schemes evidently perform their limited function, they are incapable of "fixing" larger defects in the memory which may render inoperative one or more columns (or rows) of main cells.

Prior redundancy schemes also suffer from other disadvantages. For example, some are implemented in a manner that causes an undesirably large amount of standby power to be dissipated. In addition, relatively complex circuitry has usually been required to implement the redundancy scheme, and the access time of the memory has been impaired. For these and other reasons, prior redundancy schemes have not been entirely satisfactory.

OBJECTS OF THE INVENTION

It is a general object of the invention to provide an improved redundancy scheme for an MOS memory.

It is a more specific object of the invention to provide a redundancy scheme capable of repairing relatively large defects in the memory.

It is another object of the invention to provide such a redundancy scheme which dissipates little or no standby power, which is relatively simple in construction, and which does not substantially impair the memory's access time.

BRIEF DESCRIPTION OF THE FIGURES

The objects stated above and other objects of the invention are set forth more particularly in the following detailed description and in the accompanying drawings, of which:

FIG. 3 is a detailed circuit diagram of the fuse and compare circuitry of FIG. 2;

FIG. 4 shows waveforms of clock signals input to the circuitry of FIG. 3;

DESCRIPTION OF THE PREFERRED EMBODIMENT

Figure 1:
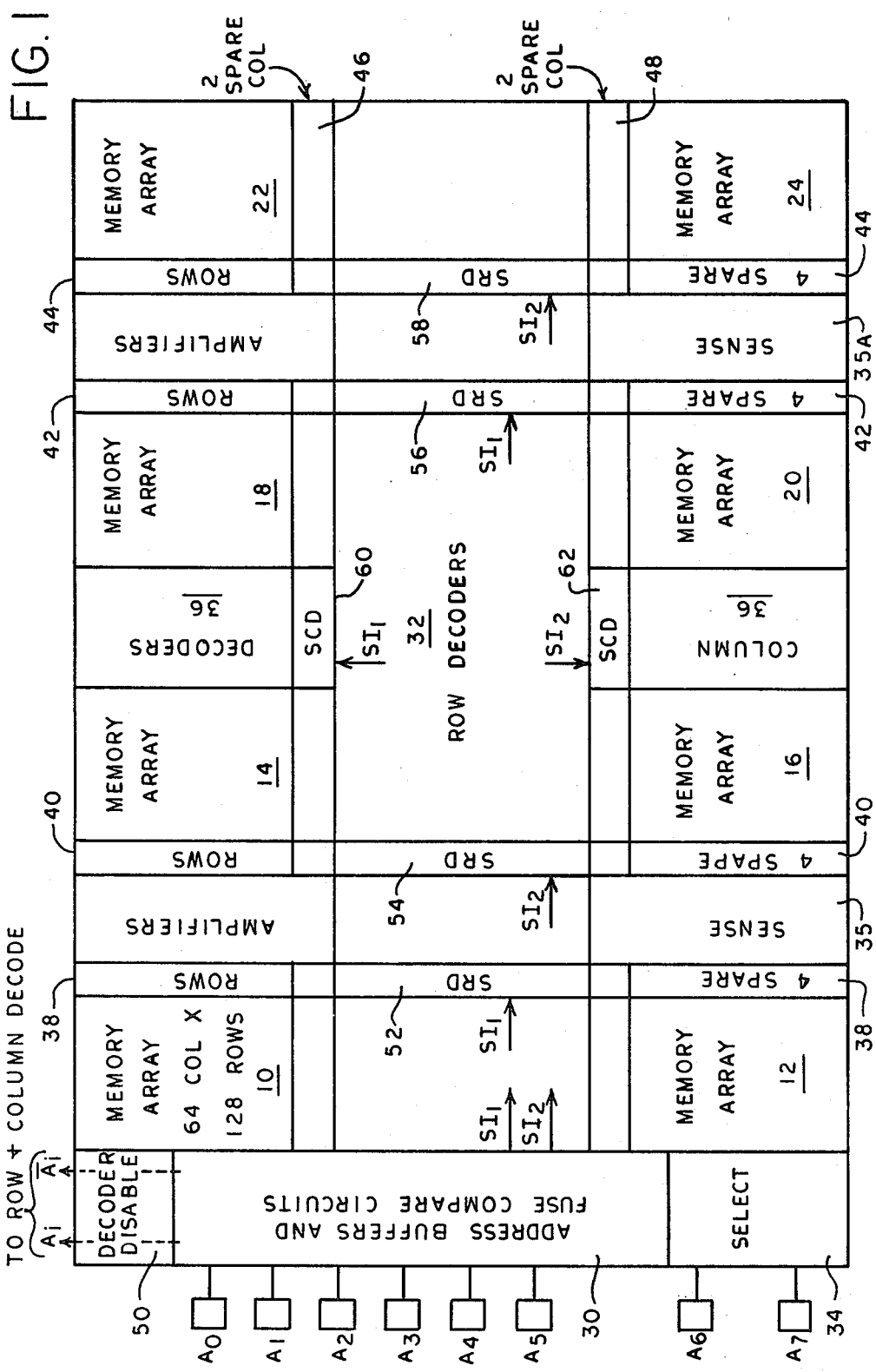
FIG. 1 illustrates, in a general manner, the architecture of a RAM employing the present redundancy scheme.

The redundancy scheme herein is described as part of a 64K dynamic RAM (random access memory). To illustrate how the redundancy scheme interfaces with the RAM, reference is made to FIG. 1 which shows the architecture of the RAM's chip.

The RAM's memory includes 256 rows by 256 columns of cells and is divided into eight main arrays or octants 10, 12, 14, 16, 18, 20, 22 and 24. Each of the latter arrays includes 64 columns by 128 rows of memory cells. To access a particular cell, one bit of row address information is received at each of the eight input pins A0–A7. The row information received at pins A0–A5 is applied to a block 30 entitled "address buffers and fuse compare circuits." Ignoring the "fuse" function for the moment, the block 30 buffers the address inputs, and for each address input, develops true and complementary address outputs $A_1$ and $\overline{A_1}$ which are used to drive row decoders 32. These decoders operate to select a group of four rows of cells from the memory.

To identify the one row which the 8 bits of address information uniquely identifies, the bits received at pins A6 and A7 are coupled to select circuitry 34. The latter circuitry typically selects one of the rows associated with one of the four previously selected rows. Sense amplifiers 35 and 35A amplify and couple the data associated with the selected row to a data output (not shown).

To select a particular column of memory cells, the input pins A0–A7 then receive an 8 bit column address word. The uniquely identified column is then accessed in the manner described above except that column decoders 36 are employed rather than the row decoders 32.

To effect redundancy, the illustrated RAM includes 16 spare rows of memory cells and 4 spare columns of memory cells. The spare rows are shown as 4 groups 38, 40, 42 and 44 of spare rows, each such group including four rows. The spare columns are shown as two groups 46 and 48 of spare columns, each such group including two columns. As described in more detail below, each of the spare groups of rows may replace four main rows of cells in the memory, as defined by A0–A5, and each of the spare groups of columns may replace any two main columns of cells in memory.

To effect substitution of either a group of spare rows or a group of spare columns, the RAM includes fuse circuitry in the block 30 for retaining addresses of defective main rows and columns of cells, decoder disable circuitry 50, spare row decoders (SRD) 52, 54, 56 and 58, and spare column decoders (SCD) 60 and 62. Generally speaking, the fuse circuitry in the block 30 is programmed during probe testing with addresses of defective cells and operates such that, when the input pins A0-A5 receive an address previously found to be that of a defective cell, spare select signals SI$_1$ and SI$_2$ are generated for enabling the spare row decoders 52-58 and the spare column decoders 60 and 62. If, for example, the inputs at pins A0-A5 receive row address information which the fuse circuitry in the block 30 identifies as the address of a defective row or rows in memory array 10, the space row decoder 52 accesses the four spare rows 38. In addition, the decoder disable circuits 50 force the signals A$_i$ and $\overline{A_i}$ high to inhibit the row decoders 32 from accessing the memory array 10. Likewise, if the information at pins A0-A5 is determined by the block 30 to be an address of a defective column or columns in the memory array 10, the signal SI$_1$ enables the spare column decoder 60 for accessing the spare column 46. In addition, the decoder disable circuits 50 disable the main column decoders 36.

In the embodiment described herein, the groups 38 and 40 of spare rows can each replace 4 rows in any of the memory arrays 10, 12, 14 or 16. The groups 42 and 44 of spare rows can each replace four rows in any of the memory arrays 18, 20, 22 and 24. The groups 46 and 48 of spare columns can replace four main columns anywhere on the chip.

Figure 2:
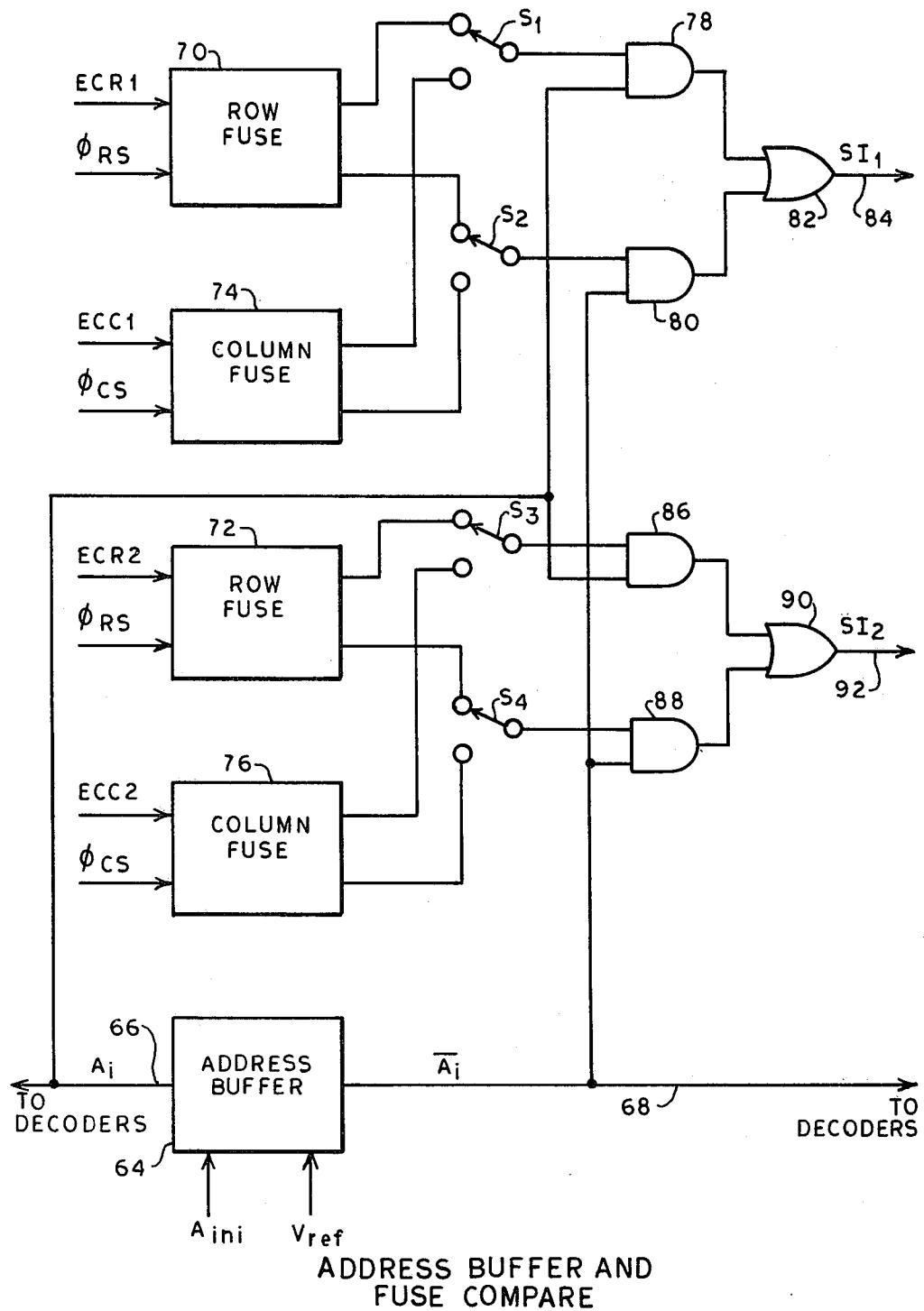
FIG. 2 is a block diagram of an address buffer and its associated fuse and comparison circuit for use in the RAM of FIG. 1.

Referring now to FIG. 2, a functional block diagram is shown of one of the six address buffers and its associated fuse circuitry included in the box 30 of FIG. 1. The address buffer 64 may be of conventional construction for receiving an input address bit A$_{in1}$ and a reference voltage V$_{ref}$. If A$_{in1}$ is greater than V$_{ref}$, the input is considered to be a logical "one," the output A$_i$ on lead 66 goes high, and the output A$_i$ on lead 68 remains low. Conversely, if A$_{in1}$ is less than V$_{ref}$, the input is considered to be a logical "zero," A$_i$ goes high, and A$_i$ remains low. The signals on the leads 66 and 68 are applied as inputs to the row decoders 32 and the column decoders 36.

Associated with the buffer 64 is a store for a defective row address comprising a pair of row fuse circuits 70 and 72, and a store for a defective column address comprising a pair of column fuse circuits 74 and 76. Referring first to the row fuse circuit 70, it receives an input identified as ECR$_1$ and a row select clock input identified as $\phi_{RS}$. During probe testing, an automatic memory tester senses the operability of all cells in the memory. When a defective cell is found, a high level signal ECR$_1$ is applied to an internal pad on the chip for application to the row fuse circuit 70 and to other similar row fuse circuits located in the block 30 (FIG. 1). As described in more detail hereinafter, the row fuse circuit 76 blows an internal fuse for storing the address of the defective cell.

The column fuse circuit 74 is similar to the row fuse circuit 70 except that it receives (during probe test) a signal identified as ECC$_1$ for storing the address of a column having a defective memory cell. The column fuse circuitry 74 is clocked by a column select signal identified as $\phi_{CS}$.

The row fuse circuit 72 and the column fuse circuit 76 are similar, respectively to circuits 70 and 74, except that the former receive test inputs identified as ECR$_2$ and ECC$_2$. With this arrangement, the row fuse circuit 70 may store one bit of an address of a defective row anywhere on the chip. Likewise, the row fuse circuit 72 may store another bit of an address of a defective row anywhere on the chip. The other five buffers and fuse circuits in the block 30 store the remainder of the address. Likewise, the column fuse circuits 74 and 76 each store a bit of an address of a defective column anywhere on the chip.

When the chip is in normal operation, i.e., after probe testing, the address stored in the fuse circuitry is compared with incoming row and column addresses. If a stored address is the same as an incoming address, a spare column and/or row is substituted for the defective column or row. To effect such comparison, the output of the row fuse circuitry 70 is coupled via switches S1 and S2 to the inputs of a comparator comprising gates 78, 80 and 82. The gates 78 and 80 also receive as inputs the incoming buffered addresses A$_i$ and $\overline{A_i}$ for comparison with the output of the fuse circuitry 70 and 74. The gates 78, 80 and 82 act essentially as an exclusive OR circuit such that, when the inputs A$_i$ and $\overline{A_i}$ match the address stored in the row fuse circuitry 70, the spare inhibit output SI$_1$ on lead 84 remains at a low level. If no such match occurs, the output SI$_1$ is pulled high.

A simultaneous comparison occurs between the buffered inputs A$_i$ and $\overline{A_i}$ and the outputs of row fuse circuit 72. The latter's output are coupled via switches S3 and S4 to another exclusive OR type comparator comprising gates 86, 88 and 90. The gates 86 and 88 also receive the signals A$_i$ and $\overline{A_i}$. If a match occurs between the signals A$_i$ and $\overline{A_i}$ and the output of the row fuse circuitry 72, a spare input output SI$_2$ at lead 92 remains low. If no match occurs SI$_2$ is pulled high.

It should be understood that, because the spare columns can replace defective main columns anywhere on the chip, either of the signals ECC$_1$ and ECC$_2$ may go high to select a particular group of columns to be replaced by spare columns. The automatic memory tester may, for example, drive the signal ECC$_1$ high on locating a first defective cell and then drive the signal ECC$_2$ high on locating a defective cell in another column. The reverse sequence may also be used. It should be understood also that the lead 84 is wire ORed to corresponding outputs of similar fuse circuitry associated with the other five address buffers in the block 30. Thus, if any one bit of an incoming row address does not match with a programmed fuse address, the line carrying the ORed spare inhibit signals SI$_1$ will be pulled high. This in turn will cause a spare row to be left unselected. If, however, all bits of the incoming address match the address programmed in the fuse circuitry, the line carrying the spare inhibit signal will remain low and a spare row will be selected.

The spare inhibit SI$_2$ is also wire ORed to similar output of fuse circuitry associated with the other five address buffers.

When a column address input is received, the switches (which may be logic operated transistors) are thrown to their other positions for comparing the buffered address inputs with addresses programmed or stored in the column fuse circuits 74 and 76. If all bits of an incoming column address match the programmed addresses of a defective column, the line carrying the ORed SI$_1$ (or SI$_2$) inhibit signals remains at a low level. If no such match occurs, that line is pulled high.

With the arrangement shown in FIG. 2, two programmable addresses (both row and column) are provided for maximum flexibility in correcting defects. With the two row fuses and the two column fuses, any two arbitrary groups of four rows and two columns can be replaced. If, for example, a defect crosses an address boundary, i.e., the defective rows or columns are identified by different addresses, the memory can still be repaired since any two arbitrary groups can be replaced.

Another advantage of the illustrated arrangement is that column address inputs and row address inputs time share a single buffer and the same comparison circuitry. Hence, a reduction in circuit complexity is provided.

A reduction in the number of fuses required in the embodiment of FIG. 2 may be effected by replacing the second row and column fuse circuits 72 and 76 with A+1 comparators, where A indicates the address of a defective cell stored in fuse circuits 70 or 74. For example, if the row fuse circuit 70 is associated with cell address 000000 and its fuse is shown, it may output a signal to an A+1 generator (which replaces row fuse circuit 72) for developing output signals indicative of a defective cell at address 000001. In this manner, the number of fuses required can be halved. While only adjacent groups of cells can be fixed in this manner, the ability to correct defects on address boundaries is maintained.

Referring now to FIG. 3, a circuit diagram is shown for the row fuse circuit 70, the column fuse circuit 74, and their common comparator. The row fuse circuit 72, the column fuse circuit 76, and their comparator may be similarly constructed.

The row fuse circuit 70 is similar to the column fuse circuit 74. Hence, a description will only be given of the operation of the citcuit 70, it being understood that the column fuse circuit 74 operates in a similar manner. As shown, the circuit 70 includes a fuse F1 which may be made of polysilicon material and which is blown during probe testing to store information indicative of the address of a defective cell. To blow the fuse F1, the circuit 70 includes transistors 94 and 98, the drain of the latter transistor being coupled to a node 100 and to the fuse F1 for carrying fuse blowing current from $V_{cc}$, through the fuse F1, and to ground when the transistor 98 is turned on. Assuming that an automatic testing machine has located a defective cell in a row associated with the circuitry 70, a high level signal identified as $ECR_1$ will be applied to the gate of the transistor 94 when the address input $A_i$ is also driven high. Consequently, the transistor 94 conducts to turn on the transistor 98, thereby providing a path for fuse blowing current through the fuse F1 and to ground through the transistor 98.

A transistor 99 is coupled to the gate of the transistor 98 to hold the voltage there at a low level except when the signals $A_i$ and $ECR_1$ are high.

Referring briefly to FIG. 4, waveforms are shown of four clock signals $\phi_{AS}$, $\phi_{AR}$, $\phi_{RS}$ and $\phi_{CS}$ which are applied to the fuse circuits 70 and 74 during normal operation of the memory.

Returning again to FIG. 3, it will first be assumed that the fuse F1 has not been blown during probe testing. The signal $\phi_{AR}$ is initially high, as shown in FIG. 4, and is applied to transistors 102 and 104 in the circuit 70, and to a transistor 106 in the circuit 74. The sources of transistors 102 and 106 are coupled to lines identified as "fuse" and "$\overline{fuse}$," respectively, so as to initially precharge both lines to a high level, such as four volts when $V_{cc}$ is equal to 5 volts. A node 108, which is coupled to the transistor 104, is also pulled high.

The gate of a grounded source transistor 110 is coupled to the node 108, wherefore the latter transistor is turned on. When the signal $\phi_{AS}$ goes high, another transistor 112, coupled to the drain of the transistor 110, is also turned on. Hence, the voltage at the drain of transistor 112 tries to fall, but it is held at a high level by the unblown impedance of the fuse F1.

The node 100 is also coupled to the gate of a transistor 114 whose source receives the signal $\phi_{AR}$ and whose drain is coupled to the node 108. When the signal $\phi_{AR}$ goes low (see FIG. 4), the transistor 114 turns on to pull the voltage at node 108 low. The latter node is coupled to the $\overline{fuse}$ line via another transistor 116 whose gate receives the signal $\phi_{RS}$. Because $\phi_{RS}$ is at a high level, the transistor 116 is on for coupling the low level at node 108 to the $\overline{fuse}$ line.

The fuse line is coupled to a transistor 118 whose gate receives the signal $\phi_{RS}$ and whose drain is coupled to the node 100. With $\phi_{RS}$ high, the transistor 118 couples node 100 to the fuse line which remains high because of the high level at node 100. Thus, with the fuse F1 unblown, the fuse line is high and the $\overline{fuse}$ line is low.

Considering the case in which the fuse F1 has been blown, the fuse and $\overline{fuse}$ lines are, of course, both initially precharged to high levels as described above when the signal $\phi_{AR}$ is high. The signal $\phi_{RS}$ is also high, thereby holding the transistor 118 on to pull the voltage at node 100 low. Because of the clock timing shown in FIG. 4, the voltage at node 100 falls no later than the signal $\phi_{AR}$ goes low. Consequently, the transistor 114 remains off. The off condition of the transistor 114 allows the $\overline{fuse}$ line to remain at its precharged high level. However, the fuse line is pulled low because the transistor 118 couples the fuse line to the low potential of the node 100. Thus, when the fuse F1 is blown, the fuse line is low and the $\overline{fuse}$ line is high.

To compare the fuse and $\overline{fuse}$ data with an incoming address from the buffer 64 (FIG. 2), a comparator comprising transistors 120, 122 and 124 is coupled to the fuse and $\overline{fuse}$ lines at the gates of transistors 120 and 122. The drains of the latter transistors receive the incoming address bits $\overline{A}$ and A, respectively, from the address buffer. If the fuse F1 had been previously blown, the fuse line is low and the $\overline{fuse}$ line is high. Now if the input A is low and the input $\overline{A}$ is high, the transistor 122 causes a node 126 to be driven low. The low level signal at the node 126 is buffered to the output lead 128 to develop a low level spare inhibit signal ($SI_1$). Consequently, a spare row decoder is enabled for accessing a spare row of memory cells. The transistor 124 receives the signal $\phi_{AR}$ at its gate in order to start the node 126 at low level.

If there is no match between the address inputs A and $\overline{A}$ on the one hand, and the fuse data on the other hand, suffice it to say that the spare inhibit signal $SI_1$ is driven to a high level for inhibiting the selection of a spare row.

The fuse circuitry 74 operates in a manner similar to that described above with respect to the fuse circuitry 70 so that the spare inhibit signal $SI_1$ is held low when an incoming column address matches the address information associated with the fuse F2.

One of the more significant aspects of FIG. 3 is the circuitry comprising transistors 110, 112 and 114 and the manner in which they are clocked. With the illustrated arrangement, a very simple circuit is provided for generating fuse and $\overline{fuse}$ data with no continuous consumption of D.C. current. It also allows one end of the fuse $F_1$ to be coupled to $V_{cc}$ for ease of fusing in N channel logic.

The circuit also reliably senses the state of the fuse F1 even though the impedance of the fuse may change but from 100 ohms in an unblown state to 1000 ohms in its blown state. This effect is due to the fact that, because all the fuse current flows through transistors 110 and 112 when $\phi_{AS}$ is high, those transistors may be sized to carry the required current to drop the potential at node 100 sufficiently for holding the transistor 114 off. Thus, even though the fuse may not blow completely, the illustrated circuit is made sensitive enough to detect a relatively small impedance change in the fuse F1.

Figure 5:
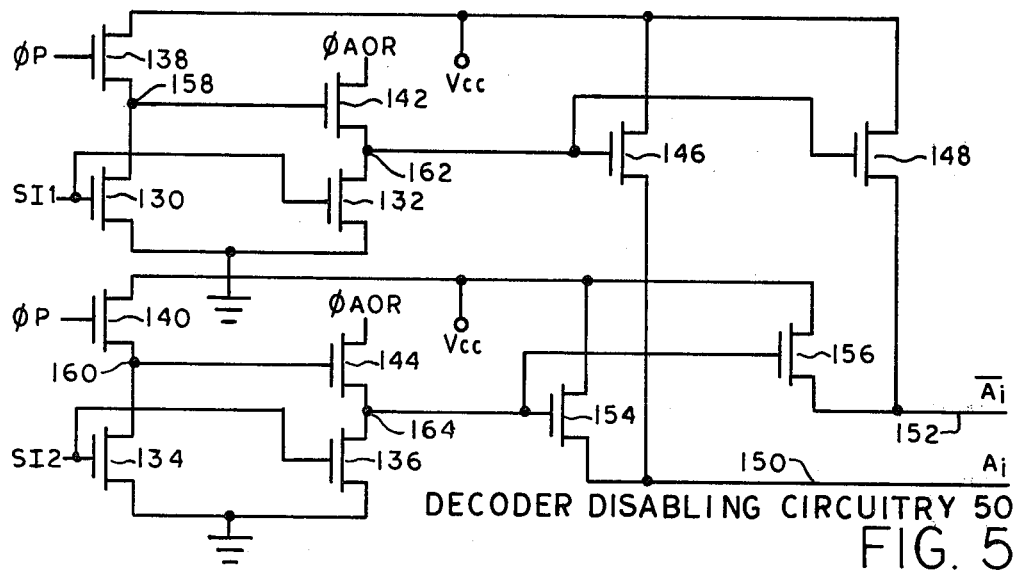
FIG. 5 shows details of the disabling circuitry of FIG. 1.

Referring now to FIG. 5, the decoder disabling circuitry 50 of FIG. 1 is shown in more detail. The illustrated circuitry includes transistors 130 and 132 which receive the spare inhibit signal $SI_1$ developed by the fuse and compare circuit of FIG. 3. Another pair of transistors 134 and 136 receive another spare inhibit signal $SI_2$ developed by additional fuse and compare circuitry which may be similar to that shown in FIG. 3 except that it operates on different address inputs.

Coupled to the drains of transistors 130 and 134, respectively, are transistors 138 and 140 whose gates receive a precharge clock signal identified as $\phi_P$. The source of the transistor 138 is coupled to the gate of another transistor 142 which receives a clock signal identified as $\phi_{AOR}$. Likewise, the source of the transistor 140 is coupled to the gate of a transistor 144 which also receives the clock signal $\phi_{AOR}$.

Figure 6:
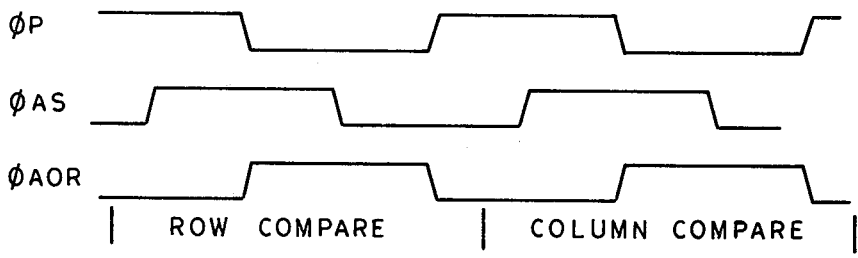
FIG. 6 depicts waveforms of clock signals which are input to the disabling circuitry.

Referring briefly to FIG. 6, the clock signals $\phi_P$ and $\phi_{AOR}$ are shown, along with the clock address select $\phi_{AS}$ to indicate the relative timing of the various clocks.

Returning to FIG. 5, the drain of the transistor 132 is coupled to the gates of transistors 146 and 148, the sources of which are coupled to leads 150 and 152. These leads force the address data signals $A_i$ and $\overline{A_i}$ to both go high when a spare row or column is selected in order to disable the row and column decoders.

The drain of the transistor 136 is also coupled to the gates of a pair of transistors 154 and 156 whose sources are coupled to leads 150 and 152.

In operation, the transistors 138 and 140 are turned on by the signal $\phi_P$ for initially precharging nodes 158 and 160 to high levels. If the signals $SI_1$ and $SI_2$ are both high (no match between an incoming address and an address of a defective cell), transistors 130 and 134 conduct to pull the voltages at nodes 158 and 160 low. When the signal $\phi_{AOR}$ goes high, the drains of transistors 132 and 136 (nodes 162 and 164) remain low. Hence, transistors 146, 148, 154 and 156 remain off and the state of the signals $A_i$ and $\overline{A_i}$ remains unaltered to prevent disabling the row and column decoders.

If the signal $SI_1$ had remained low (a match had been sensed), the node 158 would have remained high and the node 162 would have been driven high when $\phi_{AOR}$ came up. This would have turned transistors 146 and 148 on to drive the signals $A_i$ and $\overline{A_i}$ high. Consequently, the row and column decoders would be disabled.

Likewise, if the signal $SI_2$ had remained low, transistors 154 and 156 would have been turned on for driving the signals $A_i$ and $\overline{A_i}$ high. Thus, any time a match is sensed between an incoming address and the address of a defective cell, both signals $A_i$ and $\overline{A_i}$ are driven high to disable the row and column decoders.

Figure 7:
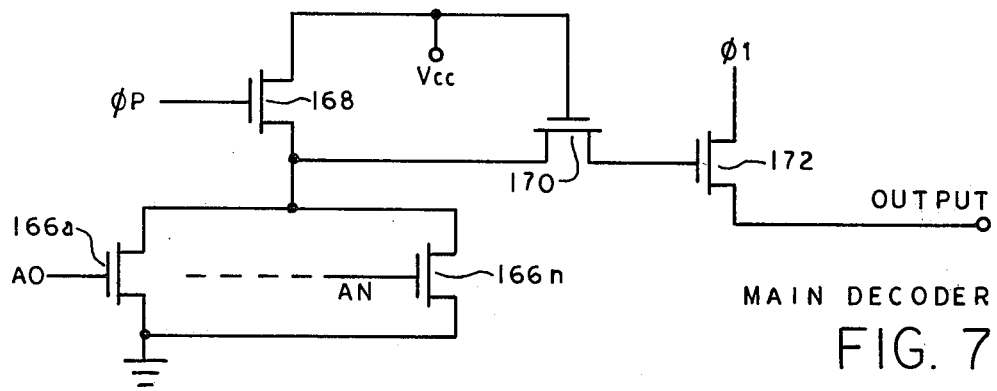
FIG. 7 shows an exemplary decoder for use in the RAM.
Figure 8:
FIG. 8 shows waveforms of clock signals which are inputs to the circuitry shown in FIGS. 7 and 9.
Figure 9:
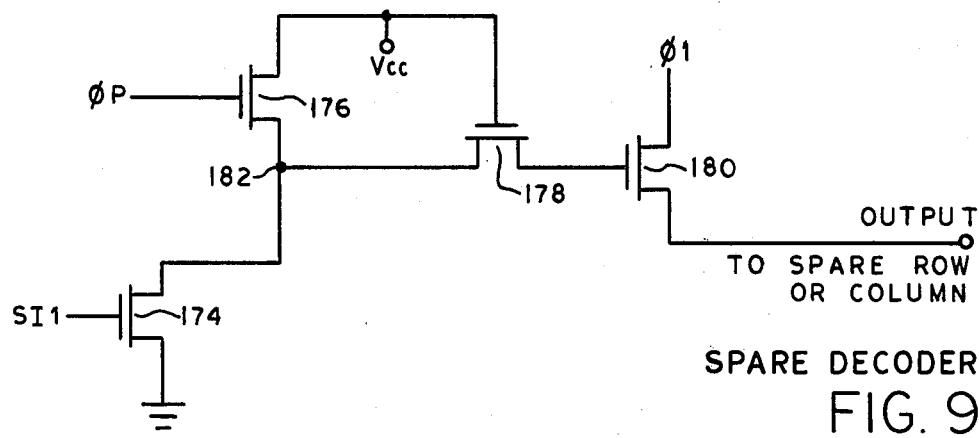
FIG. 9 shows an exemplary spare decoder for use in the RAM.

The main row and column decoders shown in FIG. 1 and the spare row and column decoders may all be conventional. FIG. 7 shows an exemplary decoder which may be used in the main row and column decoders, and FIG. 9 shows an exemplary decoder which may be used in the spare row decoder and the spare column decoder. FIG. 8 illustrates clock signals $\phi_P$ and $\phi_1$ which are input to the decoders in FIGS. 7 and 9.

Referring first to FIG. 7, the decoder shown therein includes address input transistors 166a–166n, each of which receives one bit of an address input. Coupled to the drains of transistors 166a–166n is another transistor 168 whose gate receives the precharge clock signal $\phi_P$. Its source is coupled by a transistor 170 to the gate of an output transistor 172.

Initially, the transistor 168 is turned on by the signal $\phi_P$. Then, if all address inputs remain low, the high level voltage at the source of transistor 168 is coupled to the decoder's output for selecting main columns or rows of memory cells.

The spare decoder shown in FIG. 9 includes a transistor 174 for receiving a spare inhibit signal $SI_1$ (or $SI_2$) at its gate, a transistor receiving the clock signal $\phi_P$ at its gate, and transistors 178 and 180. The clock signal $\phi_P$ turns on the transistor 176 for precharging the drain connection (node 182) of the transistor 174. If the signal $SI_1$ then goes high, the node 182 and the spare decoder's output are pulled low to prevent selection of a spare row or column. If, however, the signal $SI_1$ goes low, the decoder's output stays high for selecting a spare row or column.

Figure 10:
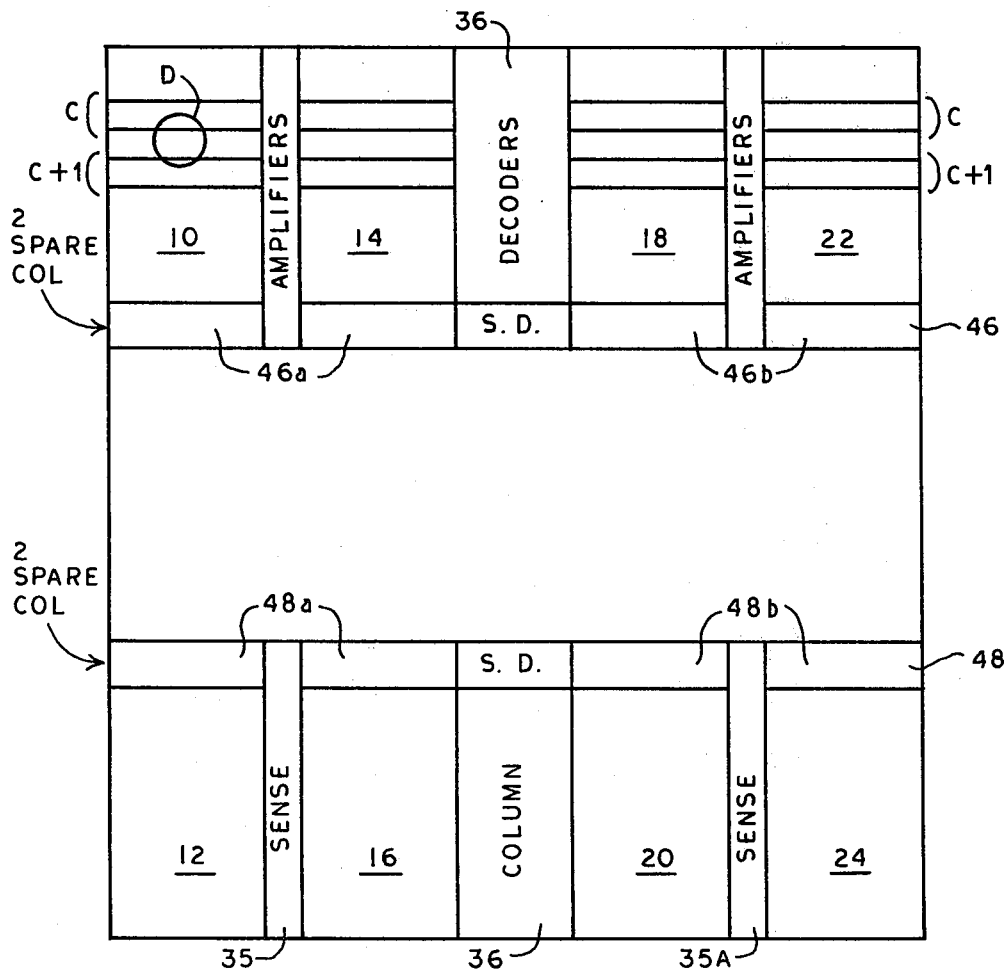
FIG. 10 is a simplified rendering of the RAM's architecture to illustrate how a large defect may be repaired.

Referring now to FIG. 10, a simplified diagram of the RAM's architecture is shown to explain an alternate way of replacing defective columns of cells. In this figure, the memory is again shown as being divided into octants 10, 12, 14, 16, 18, 20, 22 and 24. The top half of the figure shows a pair of memory columns C which extend through quadrants 10, 14, 18 and 22. Another pair of columns C+1 is adjacent the column C, and a defect D is shown which covers adjacent columns.

The two spare columns 46 may be thought of as including portions 46a and 46b, and the two spare columns 48 may be thought of as including portions 48a and 48b. According to the redundancy scheme described thus far, the defect may be cured by substituting spare column portions 48a and 48b for the entirety of main column pairs C+1. In this method of substitution, the main decoders are disabled when spare columns 46 and 48 are selected in order to prohibit access to any portion of the main memory array.

According to another aspect of the invention, a split memory array is used wherein memory columns to the left of the decoders 36 may be accessed independently of the memory columns to the right of the decoders 36. Thus, the defect D may be repaired by replacing the defective portion of main column pairs C in octants 10 and 14 with spare columns portions 46a and by replacing that portion of the defective main column pairs C+1 in octants 10 and 14 with spare column portions 46b. The operative portions of column pairs C and C+1 which reside in octants 18 and 22 are not replaced but are accessed by the main decoders. Hence, spare columns 48 may be eliminated.

In the alternate redundancy system, the main decoders cannot be totally disabled during substitution because the non-defective portions of column pairs C and C+1 in octants 18 and 22 must be able to be accessed. An accessing scheme which permits use of this alternate redundancy system is shown in FIG. 11, to which reference is now made.

Figure 11:
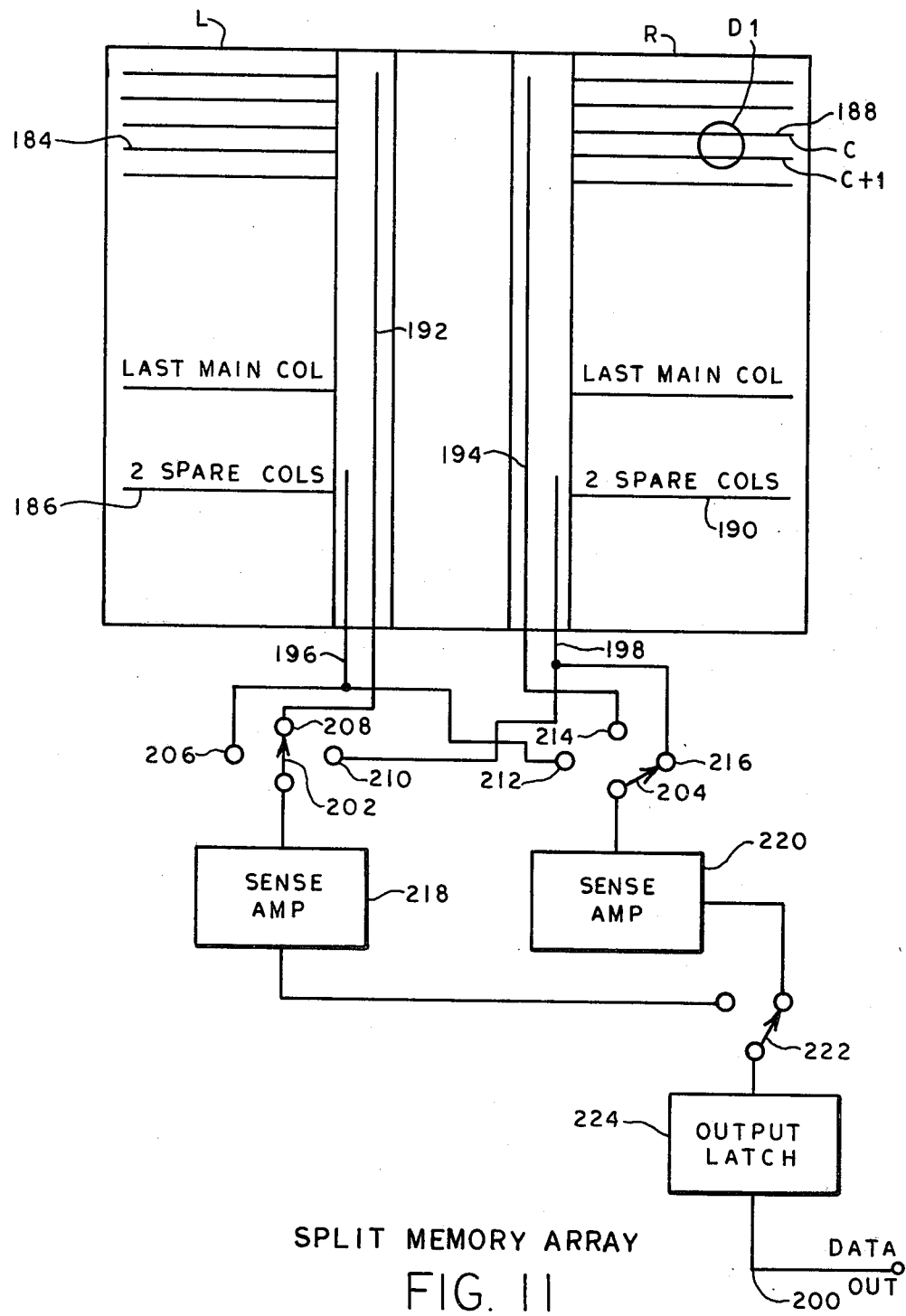
FIG. 11 shows an alternate accessing scheme for use with a split memory array having half the number of spare columns as the RAM of FIG. 1.

In FIG. 11, the memory array is shown in simplified form as having a left sector or array L associated with a plurality of main memory columns 184 and two spare columns 186. A right sector or array R is associated with main memory columns 188 and two spare columns 190. Each of the columns 184 may be thought of as a portion or extension of one of the main columns 188. In other words, each main column may have a left portion 188, each such portion containing half the memory cells of a full column. The spare columns 186 and 190 together contain the same number of memory cells as spare columns 46 in FIG. 10.

Also included are main I/O busses 192 and 194 for communicating with the main columns in the left and right arrays, respectively, and spare I/O busses 196 and 198 for communicating with the spare columns 186 and 190, respectively.

To couple the I/O busses to a data output lead 200, a pair of logic operated switches 202 and 204 are included along with switch contacts 206, 208, 210 and 212, 214 and 216. The switch contacts are coupled to the various I/O busses as shown, and the switches 202 and 204 are coupled via sense amplifiers 218 and 220 and another logic operated switch 222 to an output latch 224.

Assuming now that a defect D1 renders column pairs C and C+1 in the right array inoperative, the column pair C may be replaced by spare columns 186 and the column pair C+1 may be replaced by spare columns 190.

For example, if the column pair C+1 is addressed, data is retrieved from the operative main columns as well as from the spare columns by the switch 204 closing with the contact 216 for accessing the spare I/O buss 198, and by the switch 202 closing with contact 208 for accessing the main I/O buss 192. The data thus retrieved is coupled via the sense amplifiers 218 and 220 to the switch 222 which may be logic-operated to couple the data retrieved from the spare column 190 to the output latch 224.

When the column pair C is addressed, the switch 202 is closed with contact 206 to access the spare I/O buss 196 and switch 204 is closed with contact 214 to access the main I/O buss 194.

When no spares are selected, the switch 202 may close with the contact 208 for accessing the main I/O buss 192 and the switch 204 may close to contact 214. Thus, various combinations of switch contacts causes various main and spare columns to be accessed, all without disabling the RAM's main column decoders and yet eliminating half of the spare memory cells.

In view of the foregoing description, it can be seen that the present redundancy scheme is adapted to repair large as well as small defects which occur in the main memory cells, and is particularly well suited for repairing defects which cross an address boundary. Moreover, little or no standby power is dissipated by the redundancy circuitry, and the memory's access time is not substantially impaired.

Although the invention has been described in terms of a preferred embodiment, it will be obvious to those skilled in the art that many alterations and modifications may be made thereto without departing from the invention. Accordingly, all such alterations and modifications are deemed to be within the spirit and scope of the invention as defined by the appended claims.

What is claimed is:

1. In a RAM having a plurality of main rows and colunmns of memory cells, a redundancy scheme for repairing defects in one or more of the main rows and columns of cells, comprising:
   a pluarlity of address buffers each receiving an input bit associated with a row address and an input bit associated with a column address of a main memory cell for sequentially developing output data representing the row address and output data representing the column address;
   a store associated with each address buffer for storing the row address of a defective main memory cell;
   a store associated with each address buffer for storing the column address of a defective main memory cell;
   comparison means associated with each address store for comparing row address data in said stores against row address data from said buffer, and for comparing column address data in said stores against column address data from said buffer so as to develop a binary control signal having a first state indicative of a match between compared data and a second state indicative of a mismatch between compared data;
   a plurality of spare memory cells; and
   spare selection means responsive to the control signal being in its first state for substituting a spare cell for the defective cell, whereby a single address buffer is time shared by the row and column address stores and by the comparison means.

2. A redundancy scheme as set forth in claim 1 wherein said spare memory cells are defined by a first plurality of spare rows of cells for replacing a first plurality of main rows of cells, a second plurality of spare rows of cells for replacing a second plurality of main rows of cells, and a plurality of spare columns of cells for replacing a defective column of main cells anywhere in the RAM.

3. A redundancy scheme as set forth in claim 2 wherein said row address store includes first and second row fuse circuits each adapted to store addresses of different rows having defective cells, wherein said column address store includes first and second column fuse circuits each adapted to store addresses of different columns having defective cells, wherein said comparison means includes a first comparator associated with said first row and column fuse circuits and a second comparator associated with said second row and column fuse circuits, means for coupling output data from the address buffer to each comparator, and switch means for coupling the output of each row fuse circuit to the comparators when the data output from the address buffer comprises row addresses and for coupling the output of each column fuse circuit to the comparators when the data output of the address buffer comprises column addresses.

4. A redundancy scheme as set forth in claim 1 wherein said spare memory cells are defined by a plurality of groups of spare rows of memory cells, each such group including four spare rows, and a plurality of groups of spare columns of memory cells, each of the latter groups including a plurality of spare columns and wherein said spare selection means is adapted to substitute a plurality of groups of spare rows and columns for main rows and columns having defective cells therein so as to repair relatively large defects which may impair adjacent main rows and columns of cells.

5. A redundancy scheme as set forth in claim 1 wherein said row address store includes a row fuse circuit comprising:
   a fuse having one end thereof coupled to a positive voltage supply;
   a fuse blowing transistor coupled between ground and the other end of the fuse and adapted to receive, during probe test, a signal which turns said transistor on for conducting fuse-blowing current to ground through said fuse;

fuse and fuse output leads adapted to carry logic signals to said comparison means to indicate the status of said fuse; and fuse sensing circuitry coupled between said other end of the fuse and said output leads and adapted to be clocked for applying, to said output leads, logic levels indicative of the state of the fuse.

6. A redundancy scheme as set forth in claim 5 wherein said fuse sensing circuitry includes:

means for precharging said output leads to high logic levels;

a first transistor having its drain coupled to said other end of the fuse and adapted to receive a first clock signal at its gate;

a second transistor having its drain coupled to the source of said first transistor and having a grounded source;

a third transistor having its gate coupled to said other end of the fuse, having a source adapted to receive a second clock signal, and having a drain coupled to the gate of said second transistor;

means for selectively coupling said other end of the fuse to said fuse output lead; and means for selectively coupling the drain of said third transistor to said fuse output lead, said first clock signal being selected to go from a low level to a high level and said second clock signal being adapted to go from a high level to a low level a relatively short time after said first clock signal goes to a high level so that, when the fuse is blown, said third transistor is initially off to isolate the high level on the fuse output lead, said second transistor is on, and said first transistor turns on in response to the high level of said first clock signal for pulling low the voltage at said other end of the fuse so as to hold said third transistor off, thus maintaining the fuse output lead at its high level and pulling the fuse output lead to a low level when the fuse is blown.

7. A redundancy scheme as set forth in claim 1 wherein the RAM includes row and column decoders for selecting a main row and column of memory cells, wherein the output data from each address buffer is coupled to said decoders for selecting a particular main row and column of memory cells, and further including decoder disabling circuitry receiving the control signal from said comparison means for causing the data output of each address buffer to assume a logic state selected to disable the decoders when said control signal is indicative of a match between incoming addresses and addresses stored in said address stores.

8. In a RAM having main columns of memory cells, a plurality of spare memory cells, a main decoder for accessing the main memory cells, and a spare decoder for accessing the spare memory cells, a redundancy scheme for replacing defective main cells with spare cells without disabling the main decoder, comprising:

a memory array divided into first and second sectors, the first sector containing a portion of each main memory column and one or more spare columns, and the second sector containing the remaining portion of each main memory column and one or more spare columns;

means for accessing the main memory columns and the spare memory columns such that, when a portion of an addressed main column in said first sector is defective and its remaining portion in said second sector is not defective, the non-defective portion of said addressed column is accessed and a spare replacement column in one of said sectors is accessed in place of the defective portion of the addressed column; and means for coupling the data associated with the accessed portion of the addressed column and the replacement spare column to a data output.

9. A redundancy scheme as set forth in claim 8 wherein said accessing means includes:

a first main input/output buss for accessing the main memory column portions in the first memory sector;

a first spare input/output buss for accessing the spare memory column in the first memory sector;

a second main input/output buss for accessing the main memory column portions in the second memory sector;

a second spare input/output buss for accessing the spare memory columns in the second memory sector;

first logic-operated switch means for selectively coupling to the main input/output buss which accesses the non-defective portion of the addressed main column;

second logic-operated switch means for selectively coupling to the spare input/output buss which accesses the replacement spare column; and means for coupling said first and second switch means to the data output so as to retrieve the data accessed by the I/O busses to which said first and second switch means are coupled.

10. In a RAM having a plurality of main rows and columns of memory cells, having a plurality of spare memory cells, and having a redundancy scheme for replacing defective main memory cells with spare memory cells, an address store for storing the address of a defective main cell, comprising:

a fuse having one end thereof coupled to a positive voltage supply;

a fuse-blowing transistor coupled to the other end of the fuse for carrying current so as to blow the fuse and thereby permanently store an indication that a memory address corresponds to the address of a defective main memory cell;

fuse and fuse output leads for carrying logic data indicative of the state of the fuse;

means for precharging the fuse and fuse output leads to high logic levels;

a first transistor having its drain coupled to said other end of the fuse and adapted to receive at its gate a first clock signal selected to go from a low level to a high level;

a second transistor having its drain coupled to the source of said first transistor and having a grounded source;

a third transistor having its gate coupled to said other end of the fuse, having a source adapted to receive a second clock signal, and having a drain coupled to the gate of said second transistor; and means for selectively coupling said other end of the fuse to said fuse output lead and for simultaneously coupling the drain of said third transistor to said fuse output lead, said second clock signal being adapted to go to a low level from a high level a relatively short time after said first clock signal goes to a high level so that, when the fuse is blown, said third transistor is initially held off to isolate the high level on the $\overline{\text{fuse}}$ output lead, said second transistor is turned on, and said first transistor turns on in response to the high level of said first clock signal for pulling low the voltage at said other end of the fuse so as to hold said third transistor off, thus maintaining the $\overline{\text{fuse}}$ output lead at its high level and pulling the fuse output lead to a low level when the fuse is blown.

* * * * *